(12) United States Patent
Tran et al.

(10) Patent No.: US 9,911,501 B2
(45) Date of Patent: Mar. 6, 2018

(54) SENSING AMPLIFIER COMPRISING A BUILT-IN SENSING OFFSET FOR FLASH MEMORY DEVICES

(71) Applicant: Silicon Storage Technology, Inc., San Jose, CA (US)

(72) Inventors: Hieu Van Tran, San Jose, CA (US); Anh Ly, San Jose, CA (US); Thuan Vu, San Jose, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/163,548

(22) Filed: May 24, 2016

(65) Prior Publication Data

US 2017/0345509 A1    Nov. 30, 2017

(51) Int. Cl.
| | |
|---|---|
| *G11C 16/06* | (2006.01) |
| *G11C 16/28* | (2006.01) |
| *G11C 16/14* | (2006.01) |
| *G11C 16/24* | (2006.01) |

(52) U.S. Cl.
CPC .............. *G11C 16/28* (2013.01); *G11C 16/14* (2013.01); *G11C 16/24* (2013.01)

(58) Field of Classification Search
CPC ..... G11C 16/28; G11C 11/5642; G11C 16/24; G11C 16/26; G11C 7/065; G11C 11/4091; G11C 16/14

USPC .......................... 365/185.21, 210.1, 207, 205
See application file for complete search history.

(56) References Cited

U.S. PATENT DOCUMENTS

| | | | | |
|---|---|---|---|---|
| 5,982,666 | A  * | 11/1999 | Campardo | ............. G11C 16/28 365/149 |
| 8,588,024 | B2 * | 11/2013 | Patel | ..................... G11C 11/412 365/230.01 |
| 8,624,668 | B2 * | 1/2014 | Wan | .................... H03F 3/45475 330/9 |
| 9,549,135 | B2 * | 1/2017 | Kito | ....................... H04N 5/378 |
| 2010/0054043 | A1 |  3/2010 | Liu et al. | |
| 2017/0062036 | A1 * | 3/2017 | Glazewski | ........... G11C 11/2273 |

OTHER PUBLICATIONS

U.S. Appl. No. 14/602,262, filed Jan. 2015, Tran et al.

\* cited by examiner

*Primary Examiner* — David Lam
(74) *Attorney, Agent, or Firm* — Brent Yamashita; DLA Piper LLP US

(57) ABSTRACT

The present invention relates to an improved sensing amplifier and related method for use in read operations in flash memory devices. In one embodiment, the sensing amplifier includes a built-in voltage offset. In another embodiment, a voltage offset is induced in the sensing amplifier through the use of capacitors. In another embodiment, the sensing amplifier utilizes sloped timing for the reference signal to increase the margin by which a "0" or "1" are detected from the current drawn by the selected cell compared to the reference cell. In an another embodiment, a sensing amplifier is used without any voltage offset.

49 Claims, 14 Drawing Sheets

SENSING AMPLIFIER COMPRISING A BUILT-IN SENSING OFFSET FOR FLASH MEMORY DEVICES

TECHNICAL FIELD

The present invention relates to an improved sensing amplifier and related method for use in read operations in flash memory devices. In one embodiment, the sensing amplifier includes a built-in voltage offset. In another embodiment, a voltage offset is induced in the sensing amplifier through the use of capacitors. In another embodiment, the sensing amplifier utilizes sloped timing for the reference signal to increase the margin by which a "0" or "1" are detected from the current drawn by the selected cell compared to the reference cell. In an another embodiment, a sensing amplifier is used without any voltage offset.

BACKGROUND OF THE INVENTION

Non-volatile memory cells are well known in the art. One prior art non-volatile split gate memory cell 10, which contains five terminals, is shown in FIG. 1. Memory cell 10 comprises semiconductor substrate 12 of a first conductivity type, such as P type. Substrate 12 has a surface on which there is formed a first region 14 (also known as the source line SL) of a second conductivity type, such as N type. A second region 16 (also known as the drain line) also of N type is formed on the surface of substrate 12. Between the first region 14 and the second region 16 is channel region 18. Bit line BL 20 is connected to the second region 16. Word line WL 22 is positioned above a first portion of the channel region 18 and is insulated therefrom. Word line 22 has little or no overlap with the second region 16. Floating gate FG 24 is over another portion of channel region 18. Floating gate 24 is insulated therefrom, and is adjacent to word line 22. Floating gate 24 is also adjacent to the first region 14. Floating gate 24 may overlap the first region 14 to provide coupling from the first region 14 into floating gate 24. Coupling gate CG (also known as control gate) 26 is over floating gate 24 and is insulated therefrom. Erase gate EG 28 is over the first region 14 and is adjacent to floating gate 24 and coupling gate 26 and is insulated therefrom. The top corner of floating gate 24 may point toward the inside corner of the T-shaped erase gate 28 to enhance erase efficiency. Erase gate 28 is also insulated from the first region 14. Memory cell 10 is more particularly described in U.S. Pat. No. 7,868,375, whose disclosure is incorporated herein by reference in its entirety.

One exemplary operation for erase and program of prior art non-volatile memory cell 10 is as follows. Memory cell 10 is erased, through a Fowler-Nordheim tunneling mechanism, by applying a high voltage on erase gate 28 with other terminals equal to zero volt. Electrons tunnel from floating gate 24 into erase gate 28 causing floating gate 24 to be positively charged, turning on the cell 10 in a read condition. The resulting cell erased state is known as '1' state.

Memory cell 10 is programmed, through a source side hot electron programming mechanism, by applying a high voltage on coupling gate 26, a high voltage on source line 14, a medium voltage on erase gate 28, and a programming current on bit line 20. A portion of electrons flowing across the gap between word line 22 and floating gate 24 acquire enough energy to inject into floating gate 24 causing the floating gate 24 to be negatively charged, turning off the cell 10 in a read condition. The resulting cell programmed state is known as '0' state.

Memory cell 10 is read in a Current Sensing Mode as following: A bias voltage is applied on bit line 20, a bias voltage is applied on word line 22, a bias voltage is applied on coupling gate 26, a bias or zero voltage is applied on erase gate 28, and a ground is applied on source line 14. There exists a cell current flowing from bit line 20 to source line 14 for an erased state and there is insignificant or zero cell current flow from the bit line 20 to the source line 14 for a programmed state. Alternatively, memory cell 10 can be read in a Reverse Current Sensing Mode, in which bit line 20 is grounded and a bias voltage is applied on source line 24. In this mode the current reverses the direction from source line 14 to bitline 20.

Memory cell 10 alternatively can be read in a Voltage Sensing Mode as following: A bias current (to ground) is applied on bit line 20, a bias voltage is applied on word line 22, a bias voltage is applied on coupling gate 26, a bias voltage is applied on erase gate 28, and a bias voltage is applied on source line 14. There exists a cell output voltage (significantly >0V) on bit line 20 for an erased state and there is insignificant or close to zero output voltage on bit line 20 for a programmed state. Alternatively, memory cell 10 can be read in a Reverse Voltage Sensing Mode, in which bit line 20 is biased at a bias voltage and a bias current (to ground) is applied on source line 14. In this mode, memory cell 10 output voltage is on the source line 14 instead of on the bit line 20.

In the prior art, various combinations of positive or zero voltages were applied to word line 22, coupling gate 26, and floating gate 24 to perform read, program, and erase operations In response to the read, erase or program command, the logic circuit 245 (in FIG. 2) causes the various voltages to be supplied in a timely and least disturb manner to the various portions of both the selected memory cell 10 and the unselected memory cells 10.

For the selected and unselected memory cell 10, the voltage and current applied are as follows. As used hereinafter, the following abbreviations are used: source line or first region 14 (SL), bit line 20 (BL), word line 22 (WL), and coupling gate 26 (CG).

TABLE NO. 1

PEO (Positive Erase Operation) Table

| | WL | WL-unsel | BL | BL-unsel | CG | CG-unsel same sector | CG-unsel | EG | EG-unsel |
|---|---|---|---|---|---|---|---|---|---|
| Read | 1.0-2 V | 0 V | 0.6-2 V | 0 V-FLT | 0-2.6 V | 0-2.6 V | 0-2.6 V | 0-2.6 V | 0-2.6 V |
| Erase | 0 V | 0 V | 0 V | 0 V | 0 V | 0-2.6 V | 0-2.6 V | 11.5-12 V | 0-2.6 V |
| Program | 1 V | 0 V | 1 uA | Vinh | 10-11 V | 0-2.6 V | 0-2.6 V | 4.5-5 V | 0-2.6 V |

| | SL | SL-unsel |
|---|---|---|
| Read | 0 V | 0 V-FLT |
| Erase | 0 V | 0 V |
| Program | 4.5-5 V | 0-1 V/FLT |

In a recent application by the applicant—U.S. patent application Ser. No. 14/602,262, filed on Jan. 21, 2015, which is incorporated by reference—the applicant disclosed an invention whereby negative voltages could be applied to word line 22 and/or coupling gate 26 during read, program, and/or erase operations. In this embodiment, the voltage and current applied to the selected and unselected memory cell 10, are as follows.

terminals of the selected memory cell within memory arrays 201, 211, 221, and 231, respectively, depending on the operation being performed.

Die 200 further comprises the following functional structures and sub-systems: macro interface pins ITFC pin 248 for interconnecting to other macros on a SOC (system on chip); low voltage generation (including a low voltage charge pump circuit) circuits 247 and high voltage genera-

TABLE NO. 2

PEO (Positive Erase Operation) Table

|  | WL | WL-unsel | BL | BL-unsel | CG | CG-unsel same sector | CG-unsel | EG | EG-unsel |
|---|---|---|---|---|---|---|---|---|---|
| Read | 1.0-2 V | −0.5 V/0 V | 0.6-2 V | 0 V-FLT | 0-2.6 V | 0-2.6 V | 0-2.6 V | 0-2.6 V | 0-2.6 V |
| Erase | 0 V | 0 V | 0 V | 0 V | 0 V | 0-2.6 V | 0-2.6 V | 11.5-12 V | 0-2.6 V |
| Program | 1 V | −0.5 V/0 V | 1 uA | Vinh | 10-11 V | 0-2.6 V | 0-2.6 V | 4.5-5 V | 0-2.6 V |

|  | SL | SL-unsel |
|---|---|---|
| Read | 0 V | 0 V-FLT |
| Erase | 0 V | 0 V |
| Program | 4.5-5 V | 0-1 V/FLT |

In another embodiment of U.S. patent application Ser. No. 14/602,262, negative voltages can be applied to word line 22 when memory cell 10 is unselected during read, erase, and program operations, and negative voltages can be applied to coupling gate 26 during an erase operation, such that the following voltages are applied:

tion (including a high voltage charge pump circuit) circuit 246 used to provide increased voltages for program and erase operations for memory arrays 201, 211, 221, and 231; analog circuit 244 used by analog circuitry on die 200; digital logic circuit 245 used by digital circuitry on die 200.

TABLE NO. 3

PNEO (Positive Negative Erase Operation) Table

|  | WL | WL-unsel | BL | BL-unsel | CG | CG-unsel same sector | CG-unsel | EG | EG-unsel |
|---|---|---|---|---|---|---|---|---|---|
| Read | 1.0-2 V | −0.5 V/0 V | 0.6-2 V | 0-FLT | 0-2.6 V | 0-2.6 V | 0-2.6 V | 0-2.6 V | 0-2.6 V |
| Erase | 0 V | −0.5 V/0 V | 0 V | 0-FLT | −(5-9) V | 0-2.6 V | 0-2.6 V | 8-9 V | 0-2.6 V |
| Program | 1 V | −0.5 V/0 V | 1 uA | Vinh | 8-9 V | CGINH (4-6 V) | 0-2.6 V | 8-9 V | 0-2.6 V |

|  | SL | SL-unsel |
|---|---|---|
| Read | 0 V | 0-FLT |
| Erase | 0 V | 0 V |
| Program | 4.5-5 V | 0-1 V/FLT |

The CGINH signal listed above is an inhibit signal that is applied to the coupling gate 26 of an unselected cell that shares an erase gate 28 with a selected cell.

FIG. 2 depicts an embodiment of an architecture for a flash memory system comprising die 200 recently developed by Applicant. Die 200 comprises memory arrays 201, 211, 221, and 231, for storing data, each of memory arrays 201, 211, 221, and 231 comprising rows and columns of memory cells of the type described previously as flash memory cell 300 in FIG. 3. Die 200 further comprises sensing amplifier 243 used to read data from memory arrays 201, 211, 221, and 231; row decoder circuit 241 used to access the selected row in memory arrays 201 and 211 and row decoder circuit 242 used to access the selected row in memory arrays 221 and to be read from or written to; column decoder circuits 203, 213, 223, and 233 used to access bytes in memory arrays 201, 211, 221, and 231, respectively, to be read from or written to; high voltage row decoder WSHDR 202, 212, 222, and 232 used to provide high voltage to one or more The sensing amplifier (such as sensing amplifier 243 in FIG. 2) is an important part of any flash memory device, as it is the primary component involved in read operations. As the marketplace increasingly demands flash memory systems that consume less power while maintaining read accuracy, it is critical to develop improved sensing amplifiers to achieve those objectives.

SUMMARY OF THE INVENTION

The present invention relates to an improved sensing amplifier and related method for use in read operations in flash memory devices. In one embodiment, the sensing amplifier includes a built-in voltage offset. In another embodiment, a voltage offset is induced in the sensing amplifier through the use of capacitors. In another embodiment, the sensing amplifier utilizes sloped timing for the reference signal to increase the margin by which a "0" or "1" are detected from the current drawn by the selected cell compared to the reference cell. In an another embodiment, a sensing amplifier is used without any voltage offset.

DETAILED DESCRIPTION OF THE PREFERRED EMBODIMENT

Figure 1:
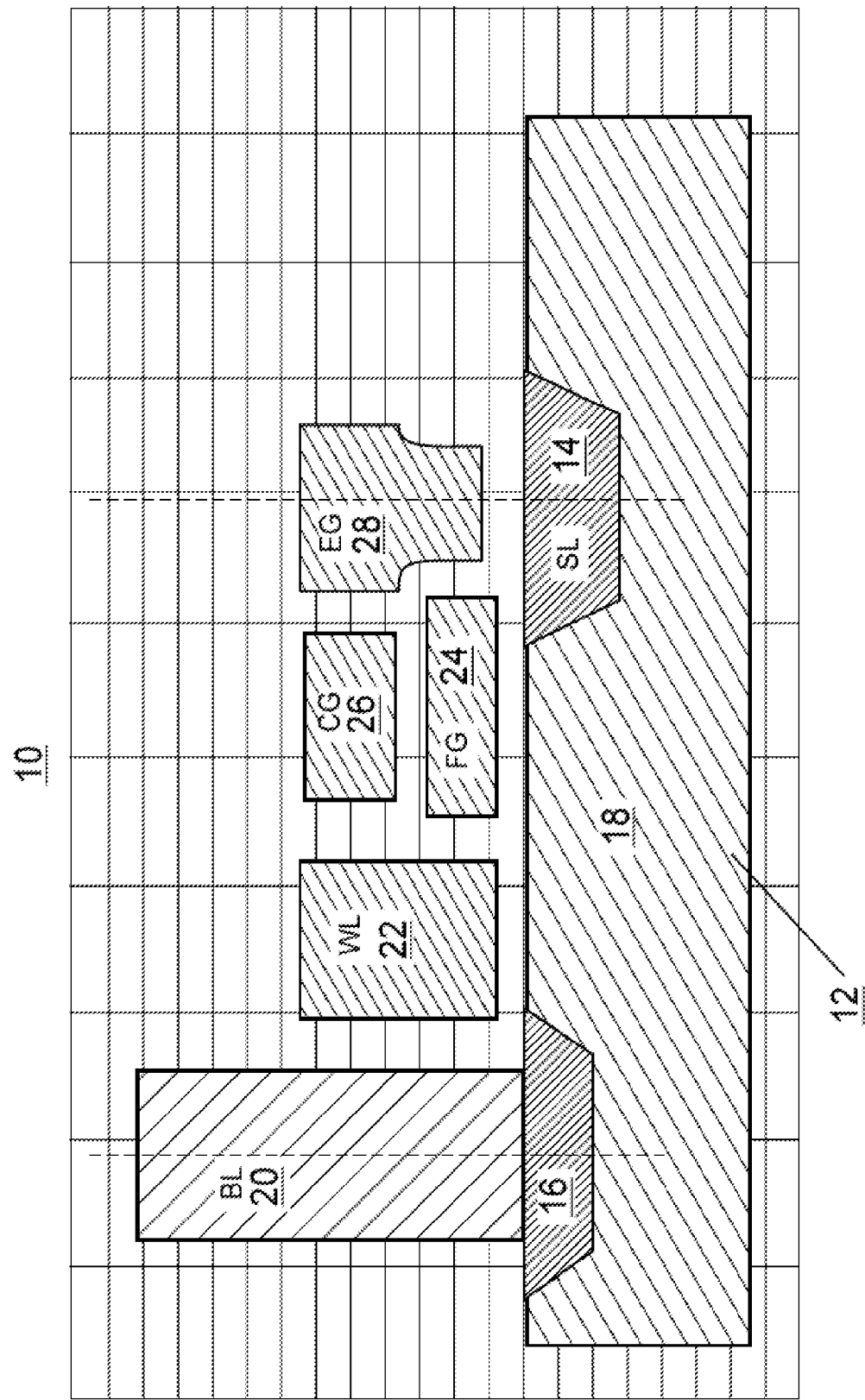
FIG. 1 is a cross-sectional view of a non-volatile memory cell of the prior art to which the method of the present invention can be applied.
Figure 2:
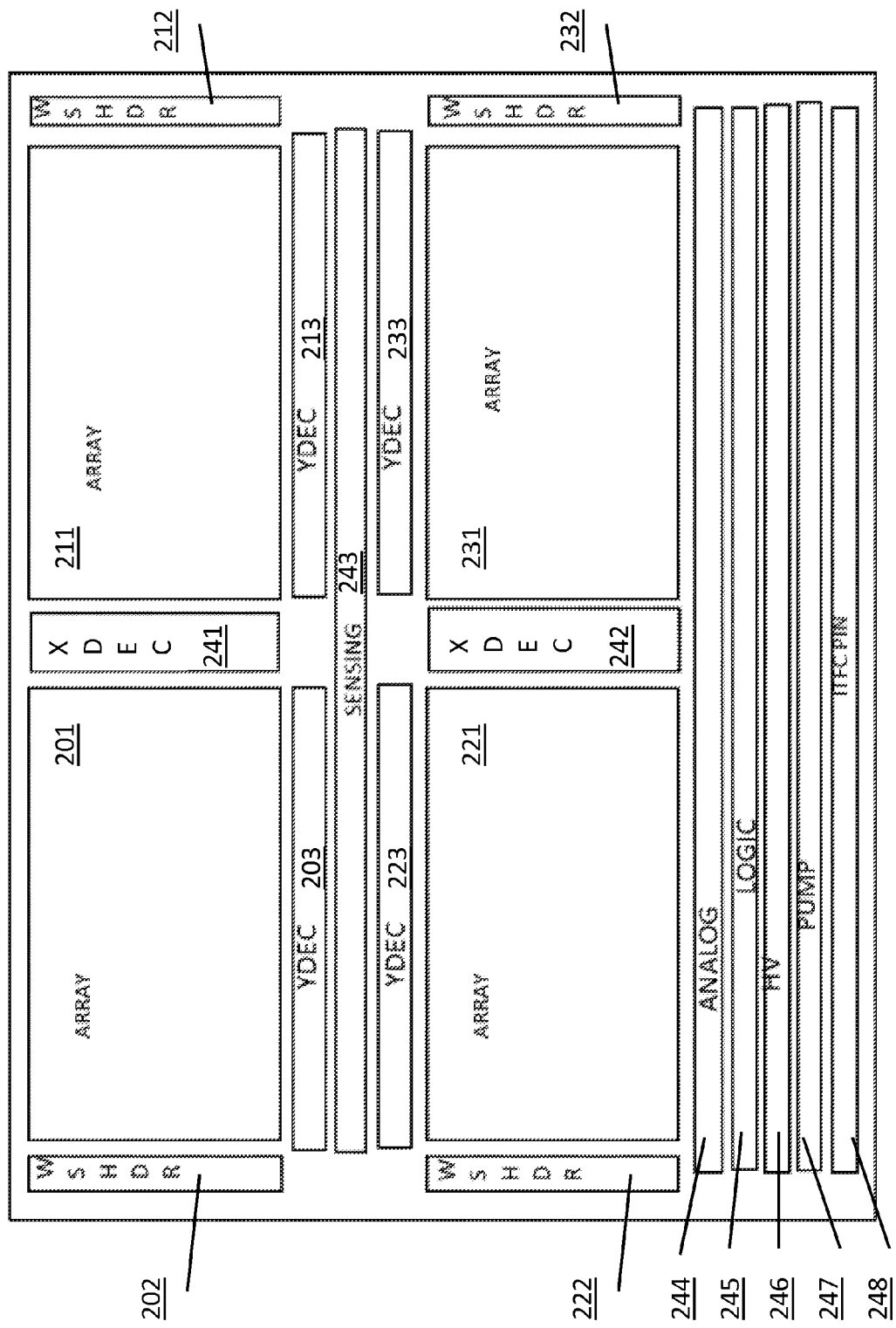
FIG. 2 is a block diagram of a non-volatile memory device using the non-volatile memory cell of the prior art shown in FIG. 1.
Figure 3:
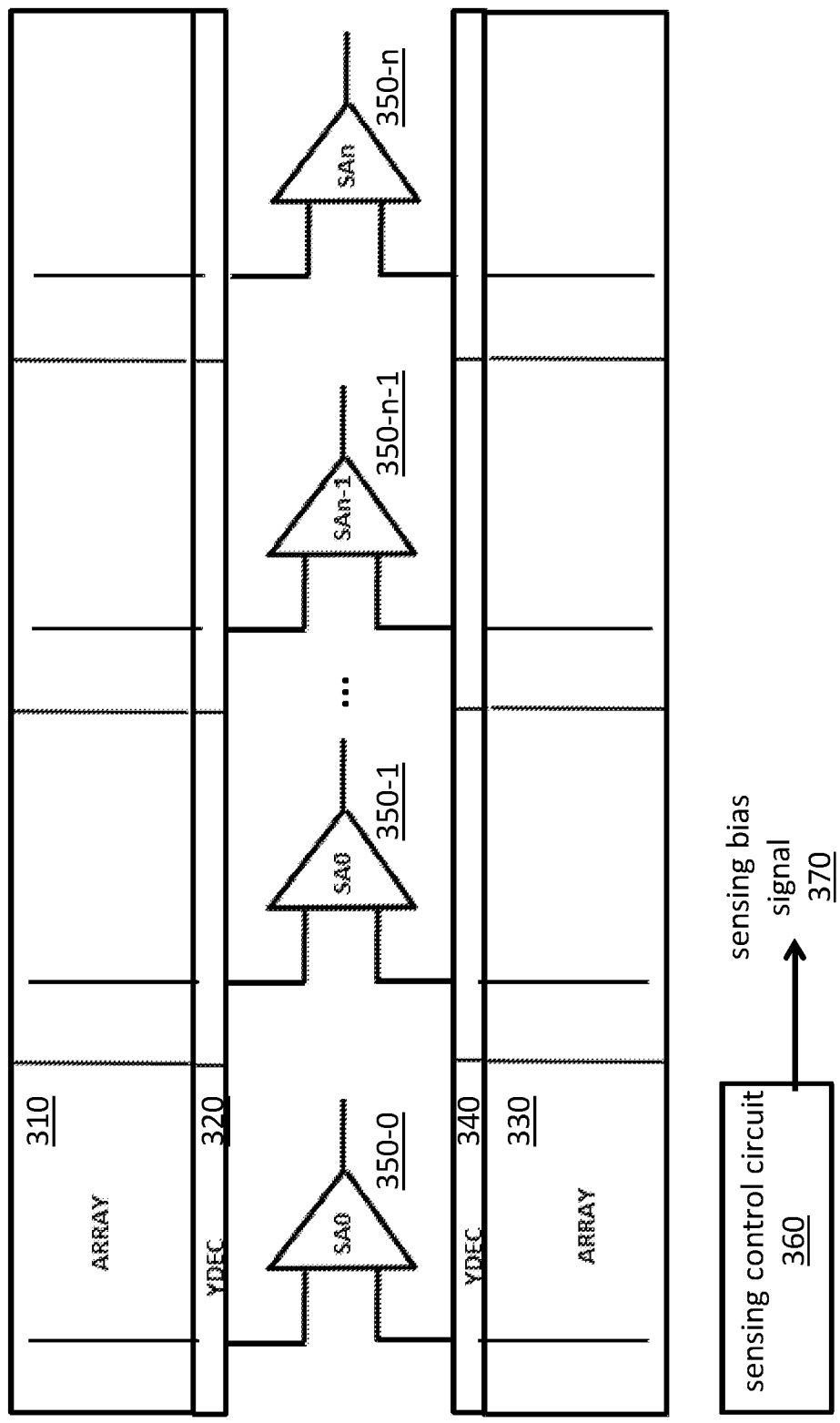
FIG. 3 is a block diagram of a flash memory array and sensing amplifiers.

FIG. 3 depicts an embodiment of an improved flash memory system 300. Flash memory system 300 comprises a first plurality of arrays 310 and a second plurality of arrays 330, each of which comprise a plurality of flash memory cells organized into rows and columns. In this example, the first plurality of arrays 310 stores data, and the second plurality of arrays comprises dummy flash memory cells used to assist in reading data from the first plurality of arrays 310 but which do not actually store data themselves.

Flash memory system 300 further comprises column decoders 320, wherein each of column decoders 320 is used in selecting a column within each array in the first plurality of arrays 310. Flash memory system 300 further comprises column decoders 340, wherein each of column decoders 340 is used in selecting a column within each array in the second plurality of arrays 330.

Flash memory system 300 further comprises n sensing amplifiers, labeled as sensing amplifier 350-0 (SA0), . . . 350-n (SAn). Each sensing amplifier is coupled to one of the column decoders 320 and one of the column decoders 340, so that during a read operation, each sensing amplifier compares a flash memory cell in an array in the first plurality of arrays 310 and a dummy flash memory cell in an array in the second plurality of arrays 330.

Flash memory system 300 further comprises sensing analog control circuit 360 which generates sensing bias signal 370. Embodiments of sensing analog circuit 360 are described with reference to subsequent figures.

Figure 4:
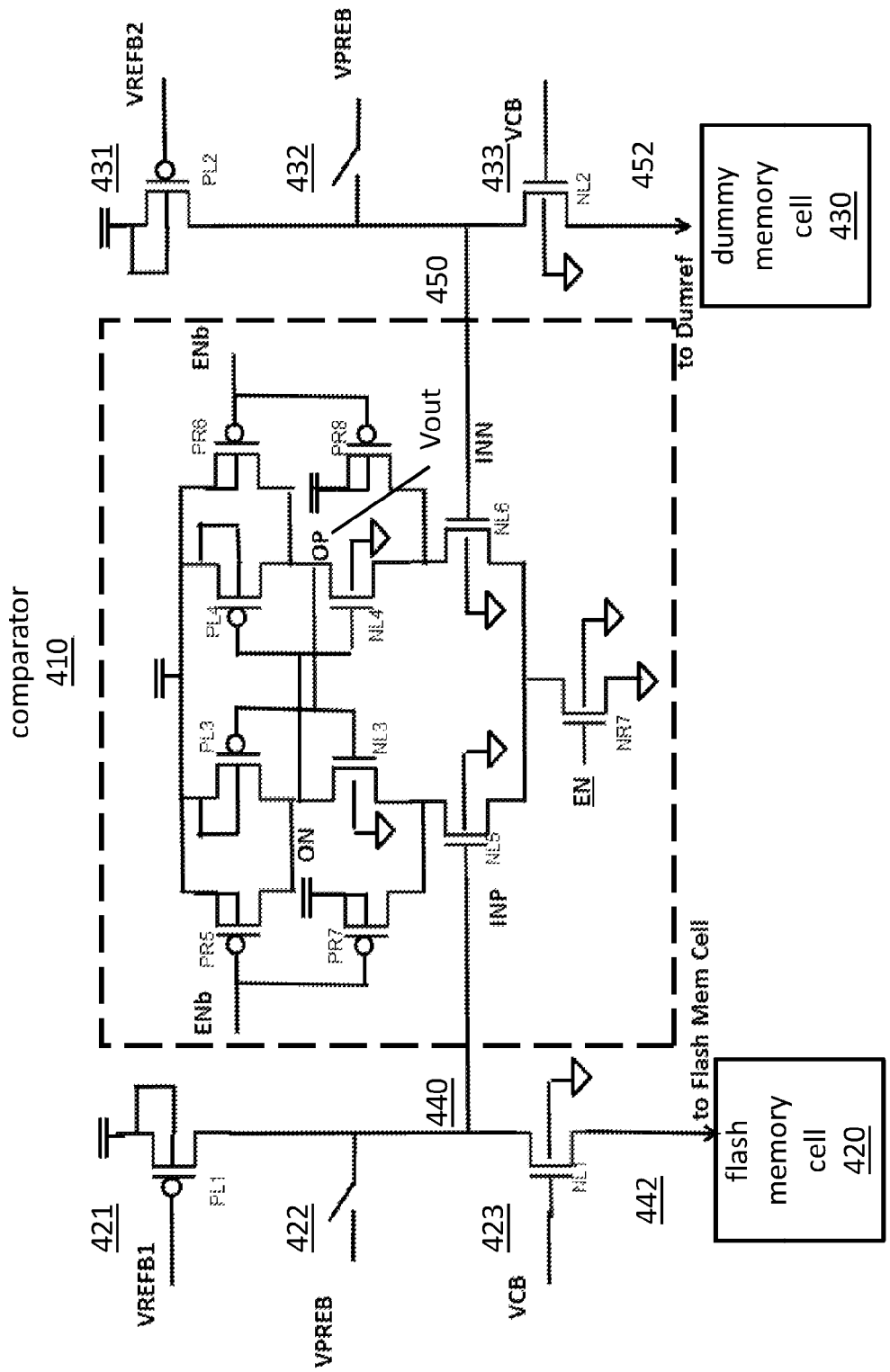
FIG. 4 depicts a prior art sensing amplifier.

FIG. 4 depicts prior art sensing amplifier 400. Sensing amplifier 400 compares the current drawn by flash memory cell 420 and the current drawn by dummy memory cell 430 using comparator 410 with selected bit line coupling node (signal) 440 and dummy bitline coupling node 450 as inputs. Transistors 423 and 433 couple selected bitline 442 (coupling to memory cell 420) and dummy reference bitline 452 (coupling to dummy memory cell 430). The output appears at the node labeled Vout (OP node) where a "low" value represents a "1" (erased cell) stored in flash memory cell 420, and a "high" value represents a "0" (programmed cell) stored in flash memory cell 420.

Figure 5:
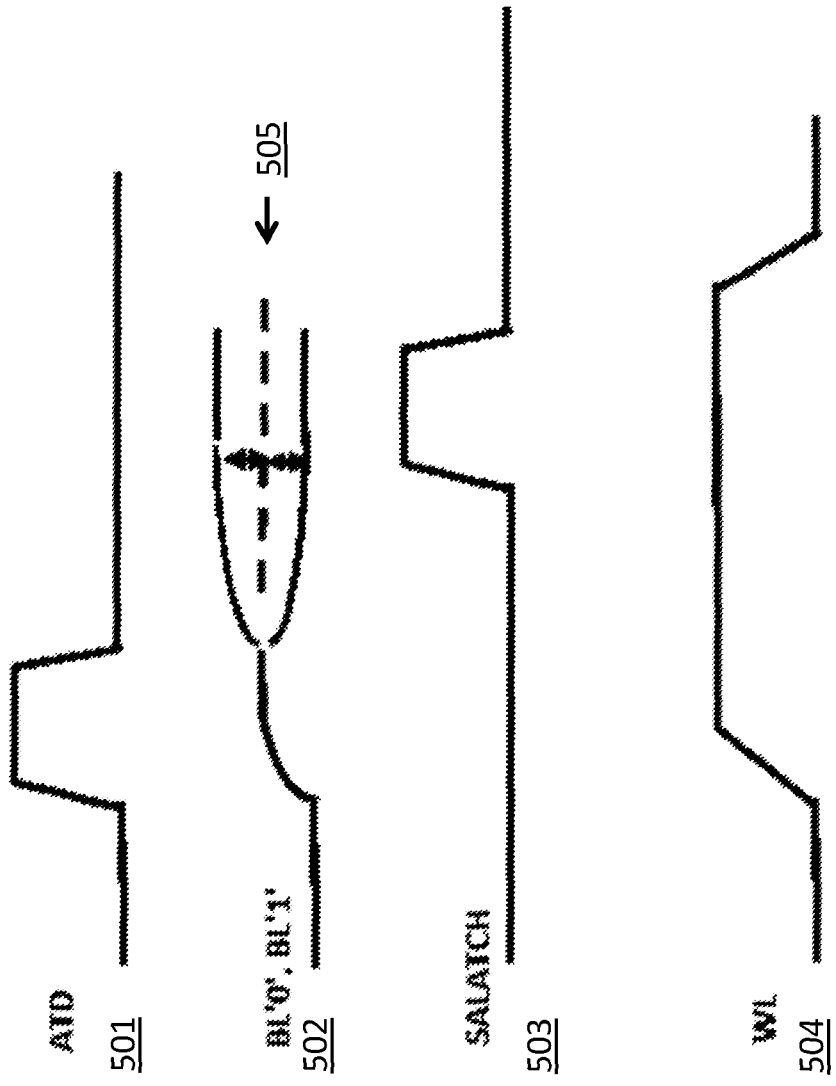
FIG. 5 depicts the operation of a prior art sensing amplifier.

FIG. 5 depicts operating characteristics of prior art sensing amplifier 400. A read operation is controlled by address transition detector signal 501, sensing amplifier latch signal 503, and word line 504. Data in a selected cell appears in bitline coupling signal 502. Bitline coupling signal 502 is biased to bias voltage 505. If the selected cell is storing a "0," (programed cell) then during the sensing operation, bitline coupling signal 502 will go above bias voltage 505, and if the selected cell is storing a "1," (erased cell) then the bitline coupling signal 502 will go below bias voltage 505. The coupling bitline (not shown) for a dummy memory cell also will be biased to bias voltage 505, and the coupling bitline for a dummy memory cell will be compared to bitline coupling signal 502 by comparator 410 to determine the value stored in the selected cell. In this example, bias voltage 505 is lower than Vdd, meaning that the sensing operation does not utilize the full voltage range from ground to Vdd.

Figure 6:
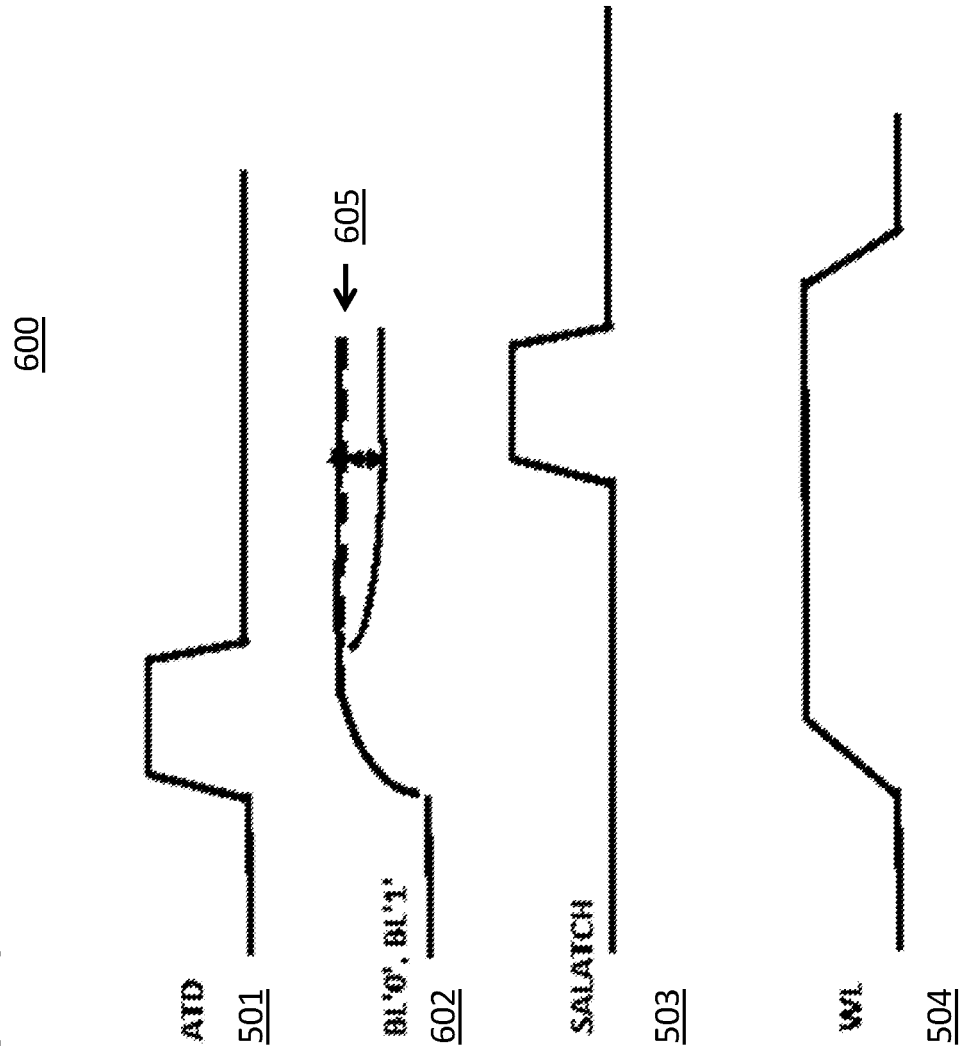
FIG. 6 depicts the operation of an embodiment of a sensing amplifier.
Figure 7:
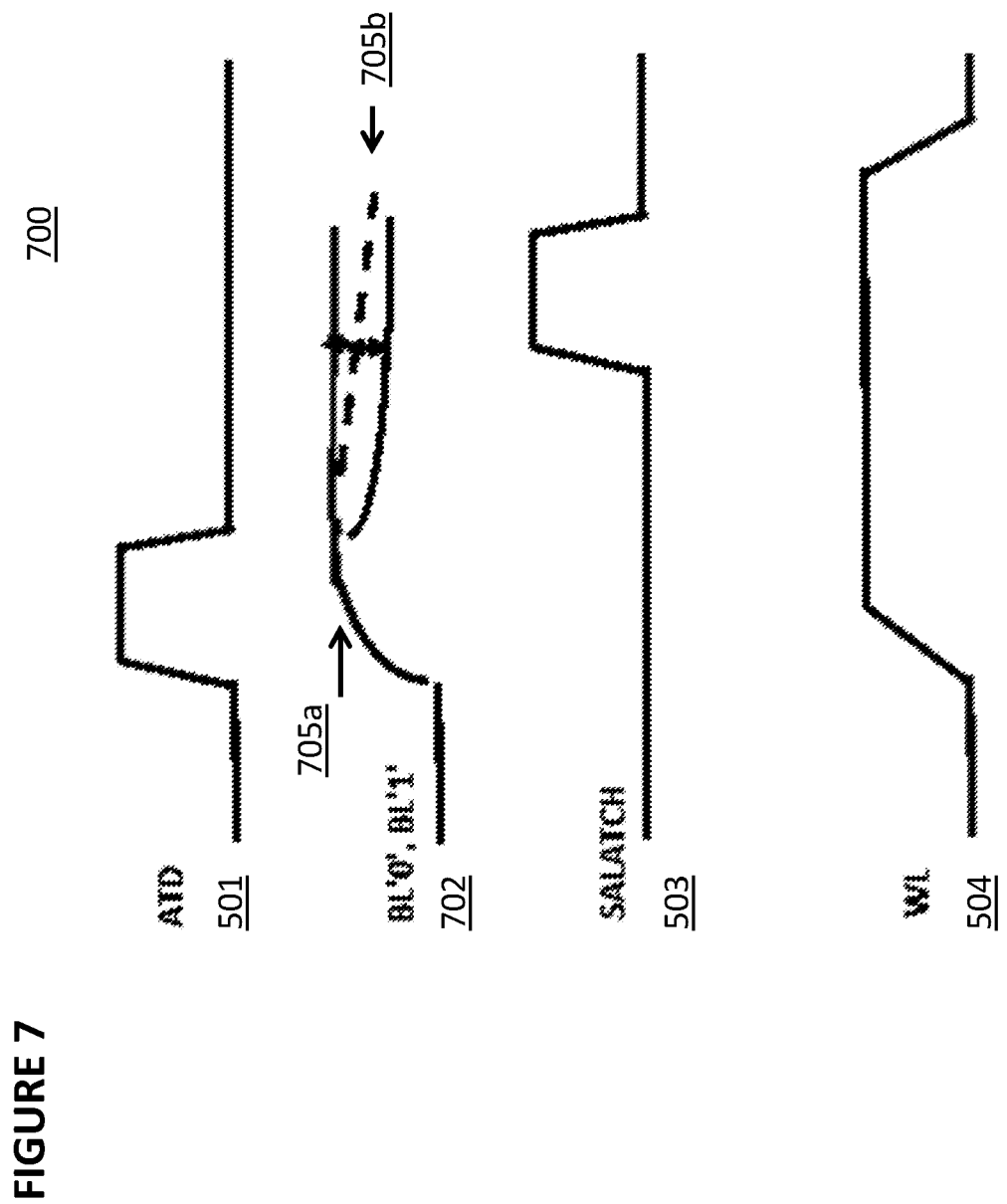
FIG. 7 depicts the operation of another embodiment of a sensing amplifier.
Figure 8:
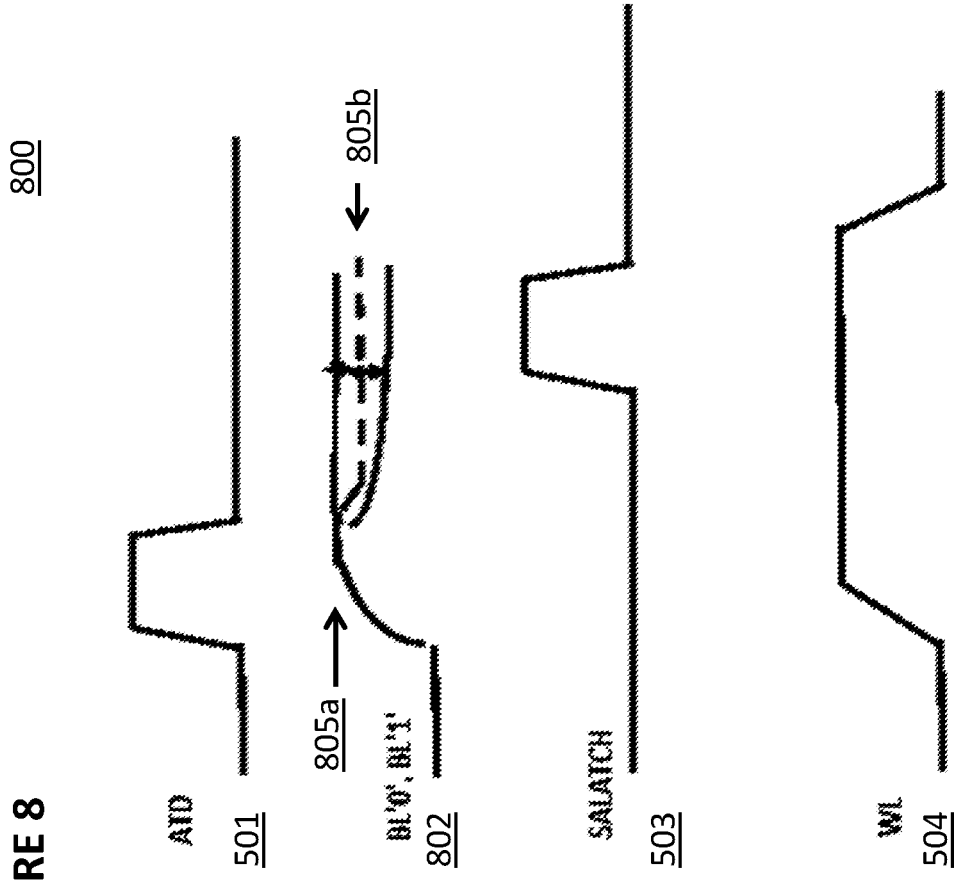
FIG. 8 depicts the operation of another embodiment of a sensing amplifier.

FIGS. 6, 7, and 8 depict operating characteristics of embodiments of sensing amplifiers according to the invention. As in FIG. 5, a read operation is controlled by address transition detector signal 501, sensing amplifier latch signal 503, and word line 504.

In FIG. 6, data in a selected cell appears in bitline coupling signal 602. Bitline coupling signal 602 is biased to bias voltage 605, which here is at the voltage level of Vdd. If the selected cell is storing a "0," then during the sensing operation, bitline coupling signal 602 will stay at bias voltage 605, and if the selected cell is storing a "1," then the bitline coupling signal 602 will go below bias voltage 605. The coupling bitline (not shown) for a dummy memory cell also will be biased to bias voltage 605, and the coupling bitline for a dummy memory cell will be compared to bitline coupling signal 502 by a comparator to determine the value stored in the selected cell. In this example, bias voltage 605 is equal to Vdd, meaning that the sensing operation utilizes a larger portion of the full voltage range from ground to Vdd compared to the prior art.

In FIG. 7, data in a selected cell appears in bitline coupling signal 702. Bitline coupling signal 702 is initially biased to bias voltage 705a, which here is at the voltage level of Vdd. If the selected cell is storing a "0," then during the sensing operation, bitline coupling signal 702 will stay at the initial level of bias voltage 705a, and if the selected cell is storing a "1," then the bitline coupling signal 702 will go below a bias voltage 705b. The coupling bitline (not shown) for a dummy memory cell also will be biased to the initial bias voltage 705a, then over time it linearly decreases to the bias voltage 705b due to small bias and the coupling bitline for a dummy memory cell will be compared to bitline coupling signal 702 by a comparator to determine the value stored in the selected cell. In this example, bias voltage 705a initially is equal to Vdd, meaning that the sensing operation utilizes a larger portion of the full voltage range from ground to Vdd compared to the prior art.

In FIG. 8, data in a selected cell appears in bitline coupling signal 802. Bitline coupling signal 802 is initially biased to bias voltage 805a, which here is at the voltage level of Vdd. If the selected cell is storing a "1," then during the sensing operation, bitline coupling signal 802 will stay at the initial level of bias voltage 805s, and if the selected cell is storing a "0," then the bitline coupling signal 802 will go below a bias voltage 805b. The coupling bitline (not shown) for a dummy memory cell also will be biased to bias voltage 805a, then over time it decreases to the lower voltage level 805b and the coupling bitline for a dummy memory cell will be compared to bitline coupling signal 802 by a comparator to determine the value stored in the selected cell. In this example, bias voltage 805a initially is equal to Vdd, meaning that the sensing operation utilizes a larger portion of the full voltage range from ground to Vdd compared to the prior art.

Figure 9:
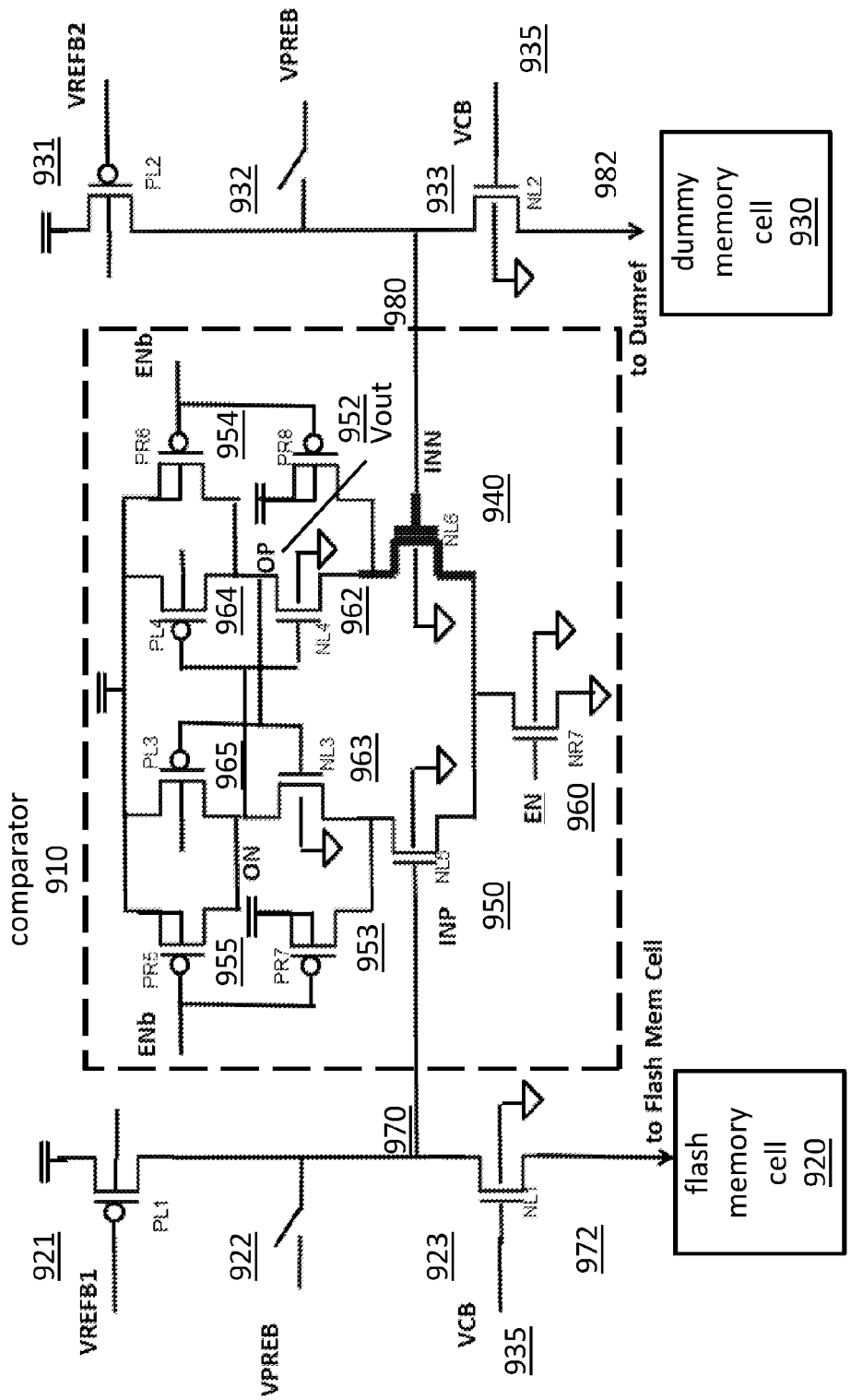
FIG. 9 depicts a first embodiment of a sensing amplifier.

FIG. 9 depicts sensing amplifier 900. Sensing amplifier 900 is coupled to flash memory cell 920 and dummy flash memory cell 930. Sensing amplifier 900 comprises comparator 910, selected bit line coupling signal (or bitline coupling node) 970, and dummy reference bit line coupling 980. The comparator 910 includes a cross coupled inverter pairs PMOS/NMOS 964/962 and PMOS/NMOS 965/963 enabled by a NMOS differential input pair 940 and 950 respectively. The comparator 910 includes PMOS 954, 955 to pre-charge the outputs of the inverter pairs 964/962 and 963/965 to Vdd respectively. The output of sensing amplifier 900 is Vout (same as OP node in the FIG. 9).

Sensing amplifier further comprises PMOS transistors 921 and 931 coupled to VDD, switches 922 and 932 coupled to a bias voltage source, and isolation NMOS transistors 923 and 933 for selectively coupling to flash memory cell 920 and dummy flash memory cell 930 in response to the signal 935, configured as shown. The transistor 921 mirrors a reference current into the node 970. The reference current is for example derived from a reference memory cell. Sensing amplifier 900 further comprises a differential input pair NMOS transistors 940, 950 and an enabling pulldown NMOS transistor 960. The transistors 923 and 933 couple the selected bitline 972 and reference bitline 982 to the bitline coupling nodes 970 and 980, which couples to the gates of the input differential pair 950 and 940. The comparator 910 includes PMOS transistors 952, 953 to pre-charge the drains of the input pair 940 and 950 to Vdd respectively. An offset in the reference voltage established on dummy bit line coupling signal 980 by dummy flash memory cell 930 can be generated through built-in characteristics of sensing amplifier 900, such as by trimming the W (width) and L (length) (i.e., physical dimension) characteristics of NMOS transistor 940, which will result in different transconductance (gm) and/or Vt values for NMOS transistor 940. This will effectively cause the reference voltage on the node 980 to be dynamically tuning to the dimension of the transistor 940. This results in an offset voltage on the node 980 versus the node 970 such as 10 mV-150 mV. In another embodiment, the built-in offset is generated in the sense amplifier is by using different types of transistor for the input differential pair NMOS transistor 940 versus the NMOS transistor 950. For example the one transistor type cane be native NMOS type (threshold voltage=~zero volt) and the other can be enhancement NMOS type. Another example is one the transistor type is low NMOS Vt type (threshold voltage=~zero volt) and the other transistor type is regular or high Vt enhancement NMOS type. Another example for different transistor types is using different oxide thickness for the input differential pair. Another embodiment to generate built-in offset in the sense amplifier is by utilizing a non-equal bias current in the input pair, such as adding a parallel current bias in one of the input pair, for example by connecting a current bias to a drain of one NMOS input transistor.

Figure 10:
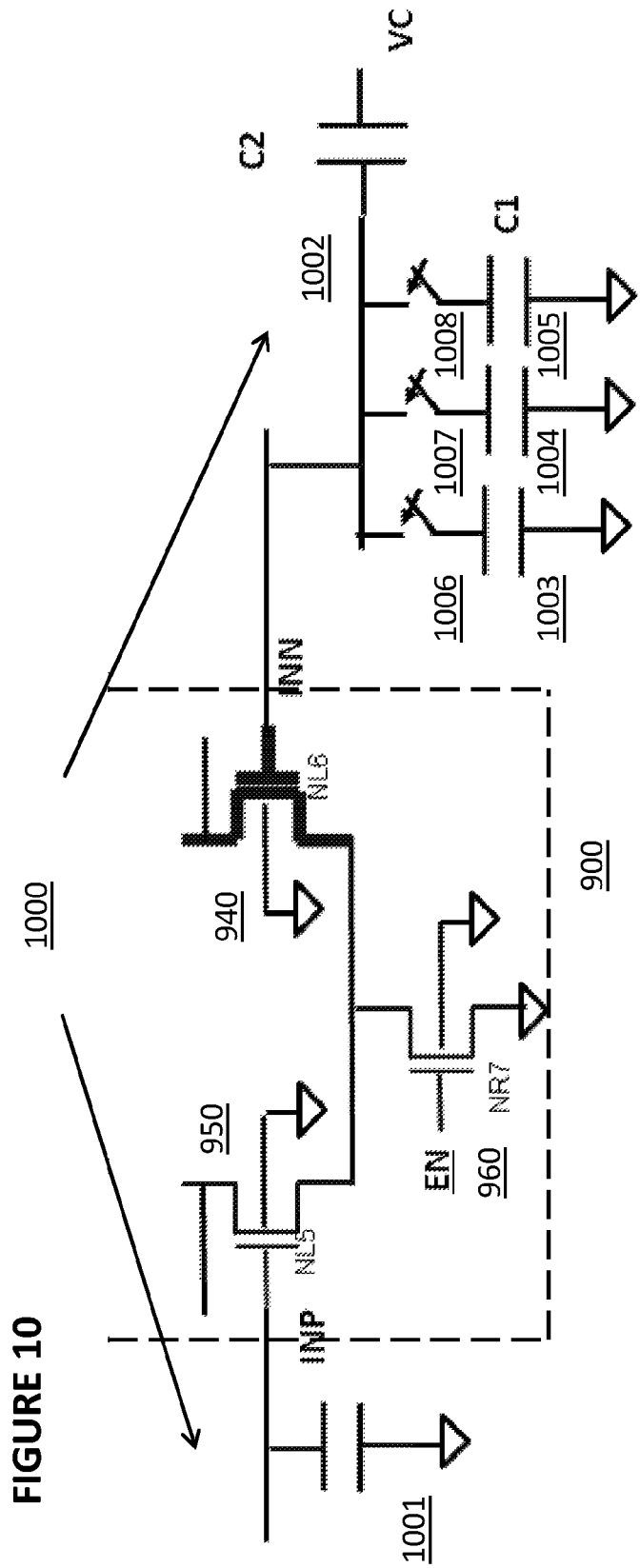
FIG. 10 depicts a second embodiment of a sensing amplifier.

FIG. 10 depicts another embodiment based on the embodiment of FIG. 9. Here, additional components 1000 are added to sensing amplifier 900. Gate of NMOS transistor 950 is coupled to capacitor 1001. Gate of NMOS transistor 940 is coupled to capacitor 1002, which is also connected to a voltage source VC. Gate of NMOS transistor 940 also is selectively coupled to capacitors 1003, 1004, and 1005 through switches 1006, 1007, and 1008, respectively, which can be turned on or off during a sensing operation as desired, to affect the overall capacitance applied to that node. The components are configured as shown. During operation, the reference voltage will be dynamically changed according to the formula: deltaV-INN=C2/(C1+C2)*VC. For example, if VC=1V, C1=10 au, C2=1 au, then deltaV-INN=~90 mV.

Figure 11:
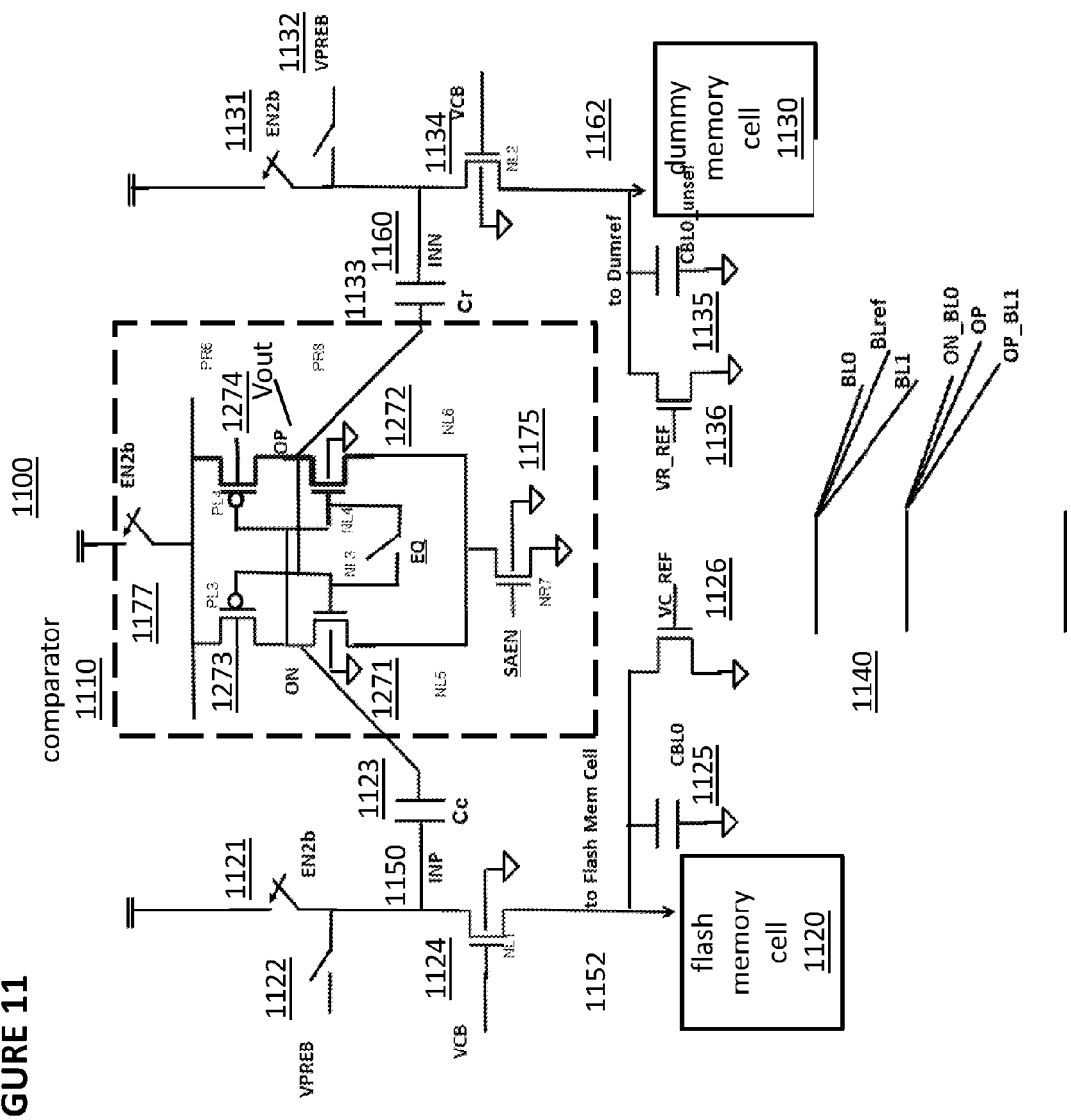
FIG. 11 depicts a third embodiment of a sensing amplifier.

FIG. 11 depicts sensing amplifier 1100. Sensing amplifier 1100 is coupled to flash memory cell 1120 and dummy flash memory cell 1130. Sensing amplifier 1100 comprises comparator 1110, selected bit line coupling signal 1150, and dummy bit line coupling signal 1160. The output of sensing amplifier 1100 is Vout. The comparator 1110 includes cross coupled inverter pairs PMOS/NMOS transistors 1273/1271 and PMOS/NMOS transistors 1274/1272 enabled by NMOS transistor 1175. In one embodiment, the dimension of the inverter PMOS/NMOS transistors 1274/1272 is sized such that to introduce an sensing offset versus inverter PMOS/NMOS transistors 1273/1271 to introduce a preferable comparison decision when voltages on node OP and ON are the same. The comparator 1110 is powered through a switch 1177. Sensing amplifier 1100 further comprises switches 1121, 1122, 1131, and 1132; coupling capacitors 1123 and 1133; isolation NMOS transistors 1124 and 1134; ramping capacitors 1125 and 1135, and ramping NMOS transistors 1126 and 1136, configured as shown. The transistors 1124 and 1134 couple the selected bitline 1152 and reference bitline 1162 to bitline coupling nodes 1150 and 1160 respectively. The nodes 1150 and 1160 couple to terminals of the capacitor 1123 and 1133 respectively. The other terminals of the coupling capacitor 1133 and 1123 couple to the outputs of the inverter pairs 1274/1272 and 1273/1271 respectively. To save power, the switches 1121,1131,1177 are disabled once result of the comparison of the comparator 1177 is decided. During a sensing operation, NMOS transistors 1125 and 1136 will discharge the bias voltage stored in capacitors 1125 and 1135, resulting in as an example waveforms 1140. The NMOS 1126 and 1136 is sized together with the size of the capacitor 1125 and 1135 to make a voltage slope ramping offset between the BLREF (reference bitline 1162 coupling to dummy memory cell 1130) and BL'0/1' (data memory bitline 1152 coupling to flash memory cell 1120). It is such as the ramping BLREF linearly decreases between the ramping BL'0' (programmed cell) and BL'1' lines (erased cell). In another embodiment the size of the capacitor 1133 is sized versus the capacitor 1123 to introduce an offset at the node OP vs. node ON.

Figure 12:
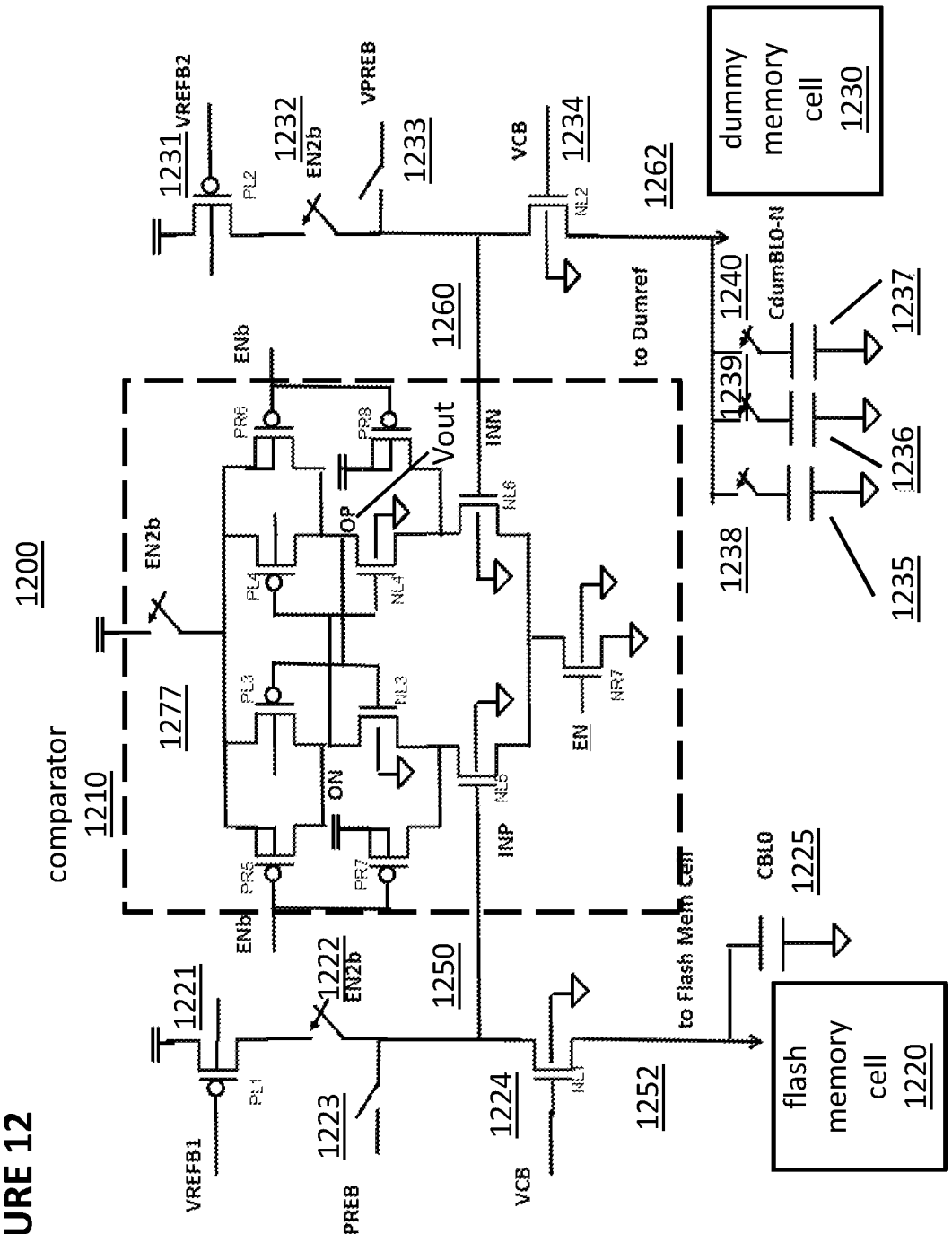
FIG. 12 depicts a fourth embodiment of a sensing amplifier.

FIG. 12 depicts sensing amplifier 1200. Sensing amplifier 1200 is coupled to flash memory cell 1220 and dummy flash memory cell 1230. Sensing amplifier 1200 comprises comparator 1210, selected bit line coupling signal 1250, and dummy reference bit line coupling signal 1260. The comparator 1210 is similar to the comparator 910 of FIG. 9 with addition of the power enabling switch 1277. The output of sensing amplifier 1200 is Vout. Sensing amplifier 1200 further comprises PMOS transistors 1221 and 1231; switches 1222, 1223, 1232, and 1233; isolation NMOS transistors 1224 and 1234; ramping capacitors 1225, 1235, 1236, and 1237; and switches 1238, 1239, and 1240, configured as shown. The transistors 1224 and 1234 couple the selected bitline 1252 and reference bitline 1262 to bitline coupling nodes 1250 and 1260 respectively. The transistor 1221 mirrors a reference current into the node 1250. The reference current is for example derived from a reference memory cell. During a sensing operation, any combination of ramping capacitors 1235, 1236, and 1237 can be coupled to the reference bitline by selectively activating switches 1238, 1239, and 1240. The bias voltage stored in capacitor 1225 will discharge over time, and the bias voltage stored the capacitors within capacitors 1135, 1136, and 1137 that are coupled to the reference bitline will discharge over time. The relative voltage slope ramp rate of the reference bitline 1262 versus the bitline 1252 is controlled by the ramping capacitors 1235-1237, capacitor 1225, and the memory cell current. In one embodiment, the ramping capacitors 1235-1237 are implemented from a plurality of bitline capacitance.

Figure 13:
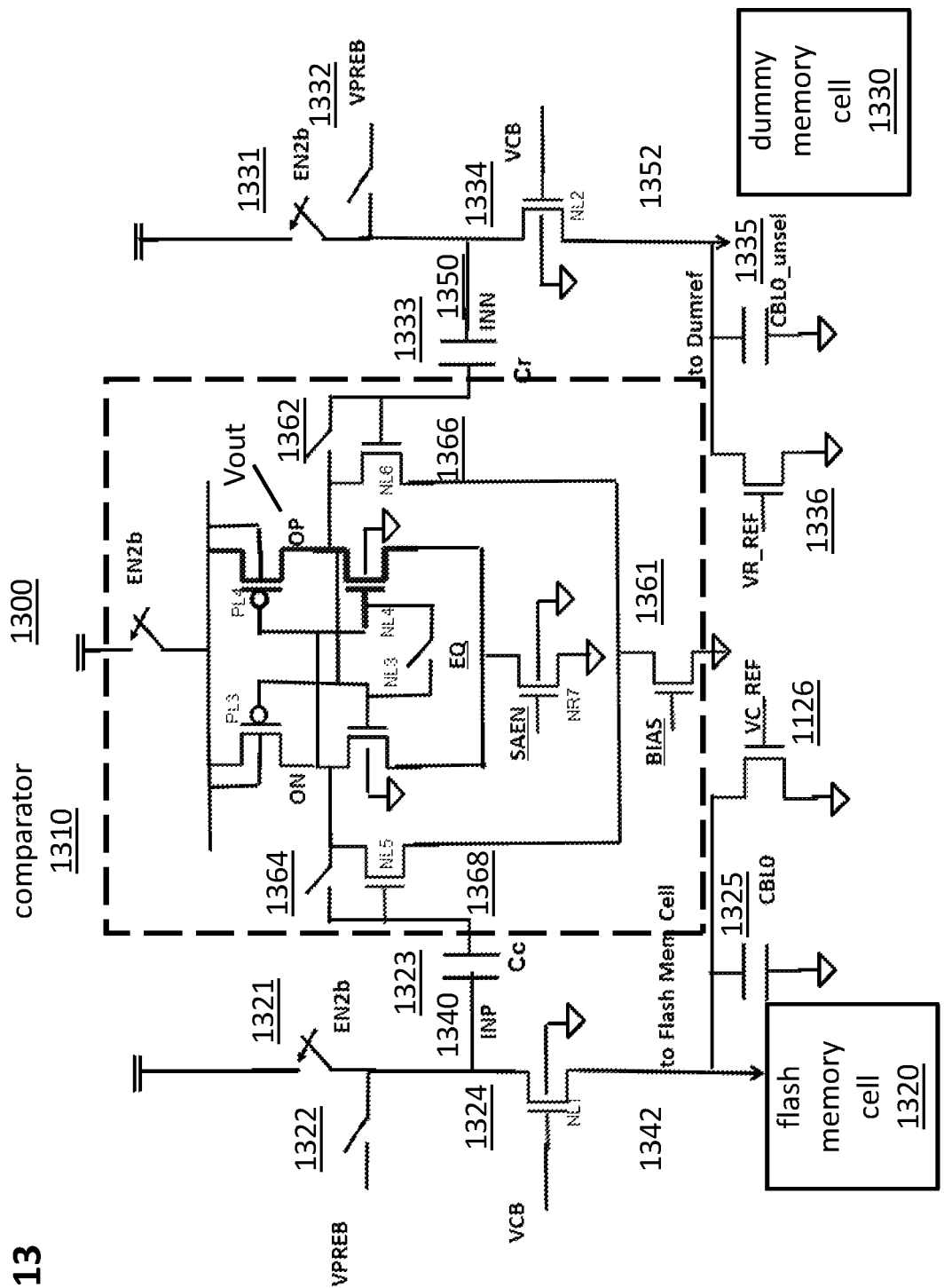
FIG. 13 depicts a fifth embodiment of a sensing amplifier.

FIG. 13 depicts sensing amplifier 1300. Sensing amplifier 1300 is coupled to flash memory cell 1320 and dummy flash memory cell 1330. Sensing amplifier 1300 comprises comparator 1310, selected bit line 1340, and dummy bit line 1350. The output of sensing amplifier 1300 is Vout. The comparator 1310 is similar to the cross-coupled inverters comparator 1110 with addition of an NMOS input pair 1366 and 1368 enabled by a NMOS pulldown 1361. Switches 1362 and 1364, couples between drain and gates of the transistors 1366 and 1368 respectively, are used to auto zero the offset of the comparator 1310. Sensing amplifier 1300 further comprises switches 1321, 1322, 1331, and 1332; coupling capacitors 1323 and 1333; isolation NMOS transistors 1324 and 1334; ramping capacitors 1325 and 1335; and ramping NMOS transistors 1126 and 1336, configured as shown. The transistors 1324 and 1334 couple the selected bitline 1342 and reference bitline 1352 to bitline coupling nodes 1340 and 1350 respectively. During a sensing operation, NMOS transistors 1326 and 1336 will discharge the bias voltage stored in capacitors 1325 and 1335 similar to the ramping offset operation of the FIG. 11.

Figure 14:
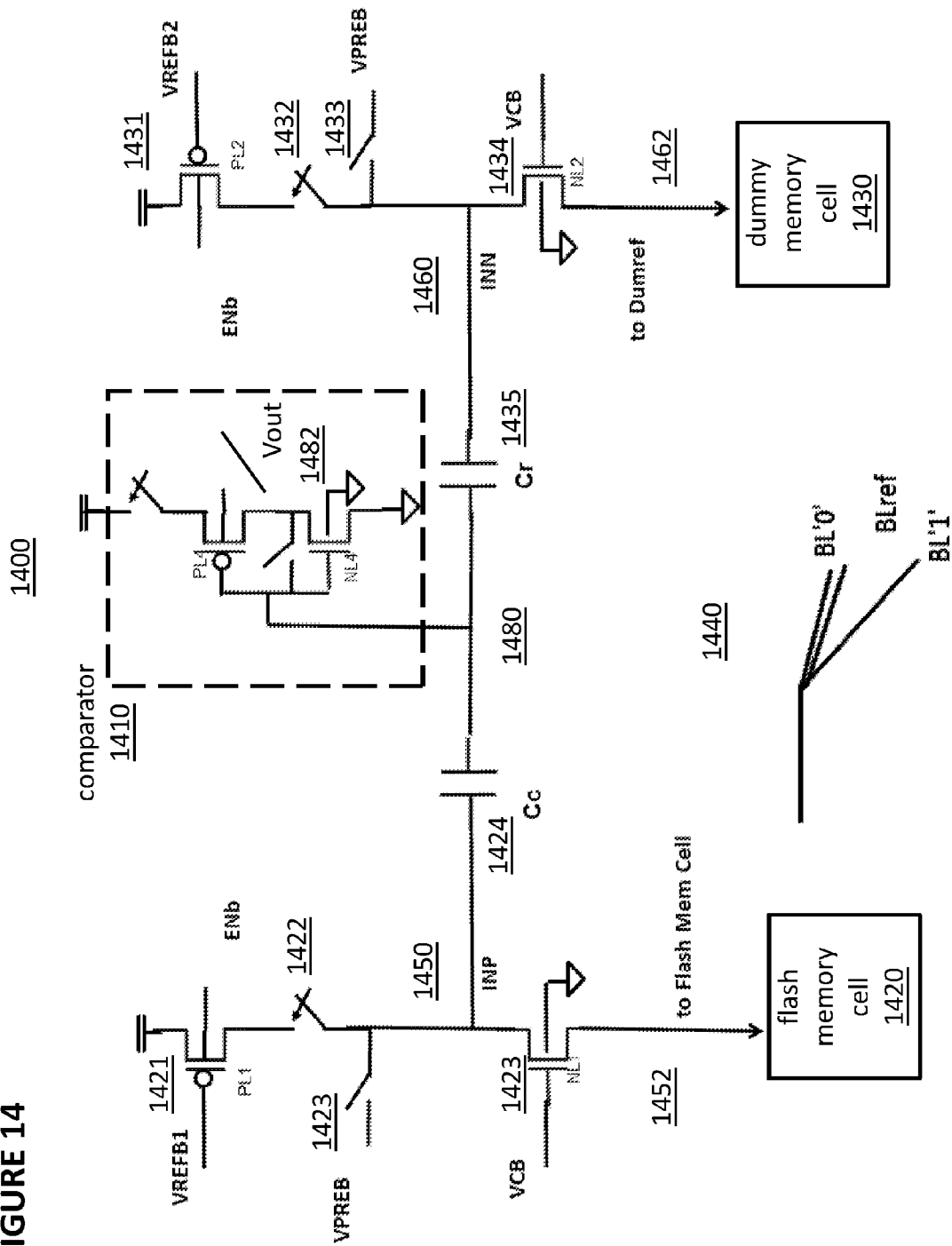
FIG. 14 depicts a sixth embodiment of a sensing amplifier.

FIG. 14 depicts sensing amplifier 1400. Sensing amplifier 1400 is coupled to flash memory cell 1420 (through memory bitline 1452) and dummy flash memory cell 1430 (through reference bitline 1462). Sensing amplifier 1400 comprises comparator 1410, selected bit line coupling node 1450, and dummy reference bit line coupling node 1460. The output of sensing amplifier 1400 is Vout (node 1482). Sensing amplifier 1400 further comprises PMOS transistors 1421 and 1431; switches 1422, 1423, 1432, and 1433; coupling capacitors 1424 and 1435; and isolation NMOS transistors 1423 and 1434, configured as shown. The transistor 1423 and 1434 couple memory bitline 1452 and reference bitline 1463 to the selected bit line coupling node 1450 and dummy reference bit line coupling node 1460 respectively. Ratio of the reference coupling capacitor Cr 1435 vs. data memory coupling capacitor Cc 1424 is used to create a sensing offset at input 1480 of the inverter comparator 1410 when the voltages on the nodes 1460 and 1450 are the same. During a sensing operation, bias voltages will be applied by capacitors 1424 and 1435 and will discharge over time basing on cell current. The offset is based on the C values of capacitors 1424 and 1435. A waveform example is shown in waveform 1440. \

What is claimed is:

1. A non-volatile memory device comprising:
   a first array of flash memory cells;
   a second array of flash memory cells;
   a sensing amplifier coupled to a selected flash memory cell in the first array and a dummy flash memory cell in the second array during a read operation, the sensing amplifier comprising:
   a comparator for comparing a selected bit line coupled to the selected flash memory cell and a dummy bit line coupled to the dummy flash memory cell;
   a first circuit for applying a bias voltage to the selected bit line and a second circuit for applying a bias voltage to the dummy bit line;
   a first input transistor coupled to the selected bit line and a second input transistor coupled to the dummy bit line; and
   a built-in sensing offset generated by one or more differences in characteristics of the first input transistor and the second input transistor.

2. The memory device of claim 1, wherein the one or more differences in characteristics comprises a difference in width of the first input transistor and the second input transistor.

3. The memory device of claim 1, wherein the one or more differences in characteristics comprises a difference in length of the first input transistor and the second input transistor.

4. The memory device of claim 1, wherein the sensing amplifier comprises latch cross coupled inverters.

5. The memory device of claim 1, wherein the sensing amplifier comprises an auto zero circuit.

6. The memory device of claim 1, wherein the sensing amplifier comprises only one inverter.

7. The memory device of claim 1, wherein the selected bitline is biased to full Vdd.

8. The memory device of claim 1, wherein the flash memory cells in the first array of flash memory cells and the flash memory cells in the second array of flash memory cells source each are injection flash memory cells.

9. The memory device of claim 1, wherein the flash memory cells in the first array of flash memory cells and the flash memory cells in the second array of flash memory cells source each are tip erased flash memory cells.

10. The memory device of claim 1, wherein the one or more differences in characteristics comprises first input transistor and the second input transistor being of different transistor types.

11. The memory device of claim 1, wherein the one or more differences in characteristics comprises one of the first input transistor and the second input transistor being a native transistor type and the other of the first input transistor and the second input transistor being an enhancement transistor type.

12. The memory device of claim 1, wherein the one or more differences in characteristics comprises the first input transistor and the second input transistor having different threshold voltages (Vt).

13. The memory device of claim 1, wherein the one or more differences in characteristics comprises first input transistor and the second input transistor having different oxide thicknesses.

14. The memory device of claim 1, wherein the first circuit comprises a first capacitor coupled to the selected bit line.

15. The memory device of claim 14, wherein the second circuit comprises a second capacitor coupled to the dummy bit line.

16. The non-volatile memory device of claim 14, wherein the second circuit comprises a plurality of capacitors selectively coupled to the dummy bit line through a plurality of switches.

17. The non-volatile memory device of claim 16, wherein the second circuit further comprises a transistor for discharging any of the plurality of capacitors that are coupled to the dummy bit line.

18. The non-volatile memory device of claim 14, wherein the first circuit further comprises a transistor for discharging the first capacitor.

19. The non-volatile memory device of claim 18, wherein the second circuit further comprises a transistor for discharging the second capacitor.

20. A non-volatile memory device comprising:
   a first array of flash memory cells;
   a second array of flash memory cells;

a sensing amplifier coupled to a selected flash memory cell in the first array and a dummy flash memory cell in the second array during a read operation, the sensing amplifier comprising:
- a comparator for comparing a selected bit line coupled to the selected flash memory cell and a dummy bit line coupled to the dummy flash memory cell;
- a first circuit for applying a bias voltage to the selected bit line and a second circuit for applying a bias voltage to the dummy bit line;
- a first inverter coupled to the selected bit line and a second inverter coupled to the dummy bit line; and
- a built-in sensing offset generated by the ratio of the first inverter and second inverter.

21. A non-volatile memory device comprising:
- a first array of flash memory cells;
- a second array of flash memory cells;
- a sensing amplifier coupled to a selected flash memory cell in the first array and a dummy flash memory cell in the second array during a read operation, the sensing amplifier comprising:
  - a comparator for comparing a selected bit line coupled to the selected flash memory cell and a dummy bit line coupled to the dummy flash memory cell;
  - a first circuit for applying a bias voltage to the selected bit line and a second circuit for applying a bias voltage to the dummy bit line;
  - a first input transistor coupled to the selected bit line and a second input transistor coupled to the dummy bit line; and
  - a built-in sensing offset generated by the application of different bias currents to first input transistor and the second input transistor.

22. A non-volatile memory device comprising:
- a first array of flash memory cells;
- a second array of flash memory cells;
- a sensing amplifier coupled to a selected flash memory cell in the first array and a dummy flash memory cell in the second array during a read operation, the sensing amplifier comprising:
  - a comparator for comparing a selected bit line coupled to the selected flash memory cell and a dummy bit line coupled to the dummy flash memory cell;
  - wherein the comparator comprises a first input transistor coupled to the selected bit line and a second input transistor coupled to the dummy bit line and a built-in offset is generated by one or more differences in characteristics of the first input transistor and the second input transistor.

23. The memory device of claim 22, wherein the one or more differences in characteristics comprises a difference in width of the first input transistor and the second input transistor.

24. The memory device of claim 22, wherein the one or more differences in characteristics comprises a difference in length of the first input transistor and the second input transistor.

25. The memory device of claim 22, wherein the one or more differences in characteristics comprises the first input transistor and the second input transistor being of different transistor types.

26. The memory device of claim 22, wherein the one or more differences in characteristics comprises one of the first input transistor and the second input transistor being a native transistor type and the other of the first input transistor and the second input transistor being an enhancement transistor type.

27. The memory device of claim 22, wherein the one or more differences in characteristics comprises the first input transistor and the second input transistor having different threshold voltages (Vt).

28. The memory device of claim 22, wherein the one or more differences in characteristics comprises the first input transistor and the second input transistor having different oxide thicknesses.

29. The memory device of claim 22, wherein the sensing amplifier comprises latch cross coupled inverters.

30. The memory device of claim 22, wherein the sensing amplifier comprises an auto zero circuit.

31. The memory device of claim 22, wherein the sensing amplifier comprises only one inverter.

32. The memory device of claim 22, wherein the selected bitline is biased to full Vdd.

33. The memory device of claim 22, wherein the flash memory cells in the first array of flash memory cells and the flash memory cells in the second array of flash memory cells source each are injection flash memory cells.

34. The memory device of claim 22, wherein the flash memory cells in the first array of flash memory cells and the flash memory cells in the second array of flash memory cells source each are tip erased flash memory cells.

35. The non-volatile memory device of claim 22, wherein the circuit comprises a capacitor coupled to the selected bit line.

36. The non-volatile memory device of claim 35, wherein the circuit further comprises a transistor for discharging the capacitor.

37. The non-volatile memory device of claim 35, wherein the circuit further comprises a transistor for discharging any of the plurality of capacitors that are coupled to the dummy bit line.

38. The non-volatile memory device of claim 22, wherein the circuit comprises a plurality of capacitors selectively coupled to the selected bit line through a plurality of switches.

39. A non-volatile memory device comprising:
- a first array of flash memory cells;
- a second array of flash memory cells;
- a sensing amplifier coupled to a selected flash memory cell in the first array and a dummy flash memory cell in the second array during a read operation, the sensing amplifier comprising:
  - a comparator for comparing a selected bit line coupled to the selected flash memory cell and a dummy bit line coupled to the dummy flash memory cell;
  - wherein the comparator comprises a first inverter coupled to the selected bit line and a second inverter coupled to the dummy bit line, and a sensing offset is generated by the ratio of the first inverter and second inverter.

40. A non-volatile memory device comprising:
- a first array of flash memory cells;
- a second array of flash memory cells;
- a sensing amplifier coupled to a selected flash memory cell in the first array and a dummy flash memory cell in the second array during a read operation, the sensing amplifier comprising:
  - a comparator for comparing a selected bit line coupled to the selected flash memory cell and a dummy bit line coupled to the dummy flash memory cell;
  - wherein the comparator comprises a first input transistor coupled to the selected bit line and a second input transistor coupled to the dummy bit line and a sensing offset is generated by the application of different bias currents to first input transistor and the second input transistor.

41. A non-volatile memory device comprising:
a first array of flash memory cells;
a second array of flash memory cells;
a sensing amplifier coupled to a selected flash memory cell in the first array and a dummy flash memory cell in the second array during a read operation, the sensing amplifier comprising:
   a comparator for comparing a selected bit line coupled to the selected flash memory cell and a dummy bit line coupled to the dummy flash memory cell; and
   a first circuit for applying a bias voltage to the selected bit line and a second circuit for applying a bias voltage to the dummy bit line;
   wherein the comparator comprises a first input transistor coupled to the selected bit line and a second input transistor coupled to the dummy bit line and an offset voltage is generated by one or more differences in characteristics of the first input transistor and the second input transistor.

42. The memory device of claim 41, wherein the one or more differences in characteristics comprises a difference in width of the first input transistor and the second input transistor.

43. The memory device of claim 41, wherein the one or more differences in characteristics comprises a difference in length of the first input transistor and the second input transistor.

44. The memory device of claim 41, wherein the sensing amplifier comprises a first inverter coupled to the selected bit line and a second inverter coupled to the dummy bit line, and the sensing offset is generated by the ratio of the first inverter and second inverter.

45. The memory device of claim 41, wherein the sensing amplifier comprises latch cross coupled inverters.

46. The memory device of claim 41, wherein the sensing amplifier comprises an auto zero circuit.

47. The memory device of claim 41, wherein the sensing amplifier comprises only one inverter.

48. The memory device of claim 41, wherein the flash memory cells in the first array of flash memory cells and the flash memory cells in the second array of flash memory cells source each are injection flash memory cells.

49. The memory device of claim 41, wherein the flash memory cells in the first array of flash memory cells and the flash memory cells in the second array of flash memory cells source each are tip erased flash memory cells.

* * * * *